(12) United States Patent
Ueno

(10) Patent No.: US 6,265,326 B1
(45) Date of Patent: Jul. 24, 2001

(54) METHOD FOR FORMING THERMAL OXIDE FILM OF SILICON CARBIDE SEMICONDUCTOR DEVICE

(75) Inventor: Katsunori Ueno, Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/109,761

(22) Filed: Jul. 2, 1998

(30) Foreign Application Priority Data

Jul. 4, 1997 (JP) .................................................. 9-178766

(51) Int. Cl.$^7$ ...................................................... H01L 21/31
(52) U.S. Cl. .......................... 438/767; 438/770; 438/931; 257/77
(58) Field of Search ...................................... 438/305, 770, 438/585, 763, 706, 773, 787, 765, 931; 432/205; 257/77

(56) References Cited

U.S. PATENT DOCUMENTS

| 5,648,282 | * | 7/1997 | Yoneda | ................................. | 438/305 |
| 5,972,801 | * | 10/1999 | Lipkin et al. | ......................... | 438/770 |
| 6,017,809 | * | 1/2000 | Inumiya et al. | ...................... | 438/585 |

FOREIGN PATENT DOCUMENTS

| 19612692C1 | * | 11/1997 | (DE) . |
| 19721114A1 | * | 11/1998 | (DE) . |
| 11031691A | * | 2/1999 | (JP) . |

OTHER PUBLICATIONS

"Fundamentals of SiC–Based Device Processing", by Melloch and Cooper, Jr. 1997 MRS Spring Meeting, Mar. 31–Apr. 4th., San Francisco, California, MRS Bulletin pp. 42–47.

"Oxidation Kinetics of 3C, 4H, and 6H Silicon Carbide", by Golz, Horstmann, Stein von Kamienski, and Kurz, Inst. Phys. Conf. Ser. No. 142 Chapter3 pp. 633–636, 1996 IOP Publishing Ltd.

* cited by examiner

*Primary Examiner*—Eddie C. Lee
*Assistant Examiner*—José R. Diaz
(74) *Attorney, Agent, or Firm*—Rossi & Associates

(57) ABSTRACT

To increase the rate or speed of formation of a thermal oxide film of a silicon carbide semiconductor device, the partial pressure of water vapor is controlled to within the range of 0.1 to 0.95 when a surface of silicon carbide is oxidized under a mixed atmosphere of water vapor and oxygen. In a pyrogenic oxidation method in which hydrogen and oxygen are introduced to perform thermal oxidation, the ratio of the flow rate of hydrogen to that of oxygen is controlled to within the range of 1:0.55 to 1:9.5. In another pyrogenic oxidation method in which hydrogen and oxygen are introduced to perform thermal oxidation, a large portion of an oxide film is formed while the ratio of the flow rate of hydrogen to that of oxygen is controlled to about 1:4.5, and a remaining portion of the oxide film is then formed while the ratio of the flow rate of hydrogen to that of oxygen is controlled to about 1:0.55.

3 Claims, 3 Drawing Sheets

METHOD FOR FORMING THERMAL OXIDE FILM OF SILICON CARBIDE SEMICONDUCTOR DEVICE

FIELD OF THE INVENTION

The present invention relates to a method for forming a silicon dioxide film by thermal oxidation in the manufacture of a silicon carbide semiconductor device using silicon carbide as a semiconductor material.

BACKGROUND OF THE INVENTION

Silicon carbide (which will be referred to as SiC) has a wide band gap, and its maximum breakdown electric field is larger than that of silicon by one order of magnitude. Thus, SiC has been highly expected to be used as a material for power semiconductor devices in the next generation. As high-quality alpha-phase single crystals, such as 6H-SiC and 4H-SiC, have been increasingly manufactured, various semiconductor devices, such as Shottky diode, MOS field-effect transistor (MOSFET), and thyristor, using SiC as a semiconductor material have been fabricated and tested, and it has been confirmed that these devices exhibit far more excellent characteristics than known devices using silicon.

When SiC is exposed to an oxidizing atmosphere (for example, dry oxygen or water vapor) at a high temperature of 1000° C. to 1200° C., a silicon dioxide film (hereinafter referred to as $SiO_2$ film) is grown on the surface of SiC, as in the case of silicon. It is also known that the $SiO_2$ film thus formed provides a desirable interface between an insulating film and a semiconductor substrate. This characteristic is peculiar to SiC, and cannot be observed in other compound semiconductor materials. Since this characteristic may be advantageously utilized to relatively easily produce MOSFET, SiC is expected to be used in a wide range of applications in the future.

Various characteristics have been revealed with respect to growth of $SiO_2$ film on SiC by thermal oxidation. For example, FIG. 3 is a graph showing the temperature dependency of the growth rate of $SiO_2$ film on SiC when it was exposed to an atmosphere composed of water vapor in a test conducted by M. R. Melloch and J. A. Copper (MRS Bulletin, March 1997, p.42). For comparison, the graph of FIG. 3 also shows the grown rate of oxide film on silicon. Other reports relating to the growth of $Si_2$ film on SiC have been published in K. Undo and Y. Seki: "Silicon Carbide and Related Materials 1995" IOP publishing p.629, and A. Golz, G. Horstmann, E. Stein von Kamienski and H. Kurz: "Silicon Carbide and Related Materials 1995" IOP publishing p.633.

As shown in FIG. 3, the growth rate of $SiO_2$ film on SiC is dependent upon the crystal orientation. Namely, the growth rate in (0001) silicon face (hereinafter referred to as Si-face) is considerably smaller than the growth rate in (000-1) carbon face (hereinafter referred to as C-face). In view of this, it may be considered to use C-face as plane orientation when fabricating SiC semiconductor devices. In fact, the interface state density of the interface between $SiO_2$ film and SiC when C-face is used for plane orientation is far higher than that in the case where Si face is used for plane orientation, and thus it will be understood that the use of C-face for plane orientation is not appropriate, in particular, in the manufacture of MOS type SiC semiconductor devices. Under these circumstances, Si-face has been generally used in recent development of SiC semiconductor devices.

The small oxidation rate or growth rate as described above means that the SiC substrate needs to be exposed to a high temperature for a long time in order to provide a sufficiently thick oxide film. For example, it is estimated from FIG. 3 that the Si-face of the SiC substrate needs to be exposed to a high temperature of 1100° C. for about 17 hours, in order to provide an oxide film having a thickness of 100 nm.

If the semiconductor substrate is subjected to heat treatment at a high temperature for such a long time, defects may arise in the semiconductor substrate, or other problems may occur during the heat treatment. For this reason, the oxidation time is desired to be reduced to be as short as possible.

Among known methods of thermal oxidation of SiC semiconductor devices, there has been generally employed a so-called wet oxidation method in which pure water is heated so as to cause bubbling of oxygen. In this method, however, it is difficult to control the partial pressure of water vapor, and drops of water are undesirably introduced into the resulting film, which tends to cause a problem of contamination.

SUMMARY OF THE INVENTION

It is therefore an object of the present invention to provide a method for forming a thermal oxide film of a silicon carbide semiconductor device, wherein a clean, thick oxide film can be formed in a short time, in particular, in Si-face of a silicon carbide substrate.

To accomplish the above object, the present invention provide a method for forming a thermal oxide film, in which water vapor and oxygen are introduced to grow a silicon dioxide film on a surface of SiC that is heated, wherein the partial pressure of water vapor represented by $p(H_2O)/[p(H_2O)+p(O_2)]$ is controlled to within the range of 0.1 to 0.9, where $p(H_2O)$ and $p(O_2)$ represent vapor pressures of water vapor and oxygen, respectively.

Although the mechanism as to how the thickness of the silicon dioxide film is influenced by the partial pressure of water vapor has not been known nor revealed, the oxidation rate or speed is increased if the partial pressure of water vapor is controlled to within the above range, as compared with the case where the partial pressure is controlled to 1.0, namely, where the oxidizing atmosphere consists solely of water vapor, whereby a $SiO_2$ film having a large thickness can be easily obtained.

If the partial pressure of water vapor is controlled to within the range of 0.1 to 0.4, in particular, the oxidation rate is almost doubled as compared with the case where the partial pressure is controlled to 1.0, namely, where the atmosphere consists solely of water vapor. In other words, the oxidation time required for growing a $SiO_2$ film having a certain thickness can be reduced to one half, compared to the oxidation time required for achieving the same thickness when the partial pressure is controlled to 1.0.

In a method for forming a thermal oxide film of a silicon carbide semiconductor device in which hydrogen and oxygen are introduced to grow a $SiO_2$ film on a heated SiC substrate by pyrogenic oxidation, the ratio of the flow rate of hydrogen to that of oxygen is controlled to within the range of 1:0.55 to 1:9.5. In this case, the oxidizing atmosphere in a furnace in which the surface of silicon carbide is oxidized has a partial pressure of water vapor which is controlled to within the range of 0.1 to 0.95.

If the flow rate of hydrogen to that of oxygen is controlled to within the range of 1:2 to 1:9.5, the partial pressure of water vapor contained in an oxidizing atmosphere in a furnace can be controlled to within the range of 0.1 to 0.4.

In a method for forming a thermal oxide film of a silicon carbide semiconductor device in which hydrogen and oxygen are introduced to grow a silicon dioxide film on a heated SiC substrate by pyrogenic oxidation, an oxide film providing a large proportion of the final thickness of the silicon dioxide film is initially formed while the ratio of the flow rate of hydrogen to that of oxygen is controlled to about 1:4.5, and an additional oxide film having the remaining thickness is then formed while the ratio of the flow rate of hydrogen to that of oxygen is controlled to about 1:0.55.

The inventor of the present invention have found that the interface state density can be reduced as the hydrogen flow rate is increased relative to the oxygen flow rate. In this case, a large portion of a silicon dioxide film having most of the final film thickness can be formed at a high oxidation rate within a reduced oxidation time, and the remaining portion of the silicon dioxide film can be formed under a condition that provides a low interface state density, whereby the interface state density of the resulting silicon dioxide film can be advantageously lowered.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

In a method for forming a thermal oxide film of a silicon carbide semiconductor device of the present invention as described later, pyrogenic oxidation is employed in which hydrogen and oxygen gases are introduced and reacted with each other to produce water, thereby to provide a wet atmosphere. Since this method uses gases as supply sources, the level of contamination can be remarkably lowered, and the partial pressure of water vapor can be precisely or subtly controlled.

Referring to the graphs showing results of experiments, the method for forming a thermal oxide film of the present invention will be described in detail.

Preliminary Experiment

In this experiment, silicon was subjected to thermal oxidation in an atmosphere which was controlled by changing the flow rates of hydrogen and oxygen to be introduced, so as to vary the partial pressure of water vapor in the atmosphere. For example, the oxidizing atmosphere may be produced by controlling the ratio of the flow rate of hydrogen to that of oxygen to 1:1.5, 1:1, and 1:0.7, so that the partial pressure of water vapor become equal to 0.5, 0.67, and 0.83, respectively.

Figure 4:
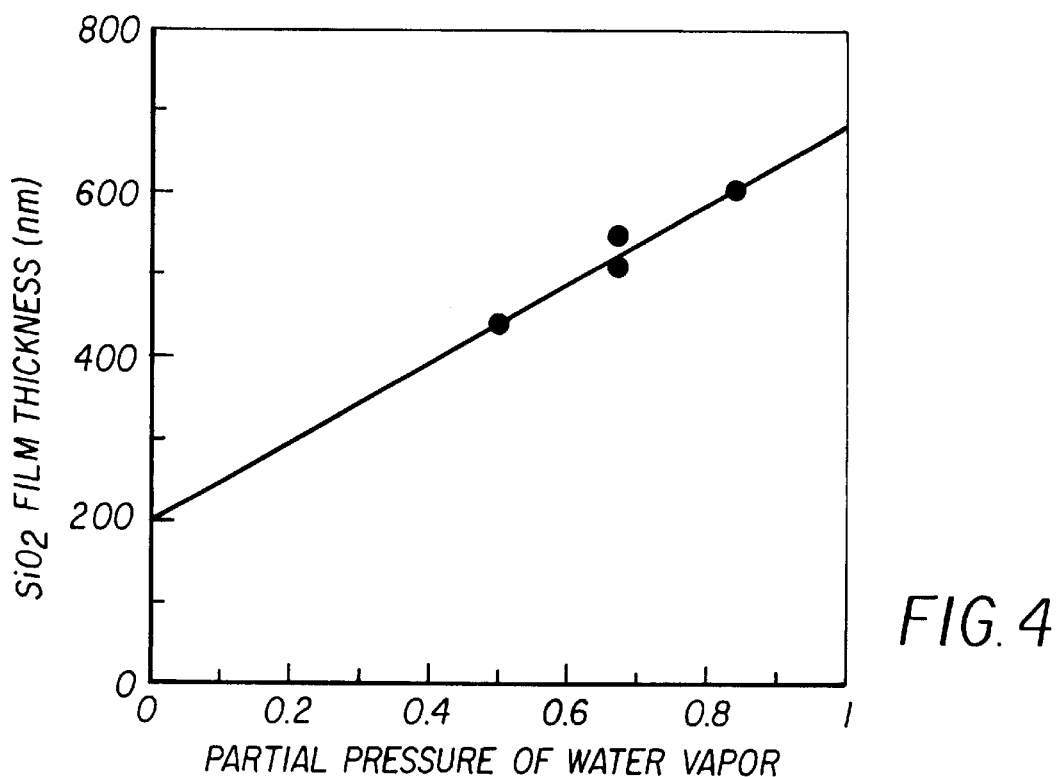
FIG. 4 is a graph showing the relationship between the thickness of oxide film formed on silicon, and the partial pressure of water vapor.

FIG. 4 is a graph showing the dependence of the thickness of oxide film formed by thermal oxidation of silicon, on the partial pressure of water vapor. The thermal oxidation was conducted at 1000° C. for 160 min. The horizontal axis represents the partial pressure of water vapor in the oxidizing atmosphere. The total pressure of this atmosphere is 1 atm, and the remainder of water vapor consists of oxygen. It will be understood from the graph of FIG. 4 that the thickness of the oxide film is increased with an increase in the proportion of water vapor.

The above experimental results indicate that the thickness of the oxide film is increased as the atmosphere varies from dry oxygen to wet oxygen. The maximum oxidation rate can be obtained when the partial pressure of water vapor is 1.0, namely, when the thermal oxidation is conducted in an atmosphere consisting solely of water vapor.

Experiment 1

It had been assumed that experimental results with respect to SiC would be similar to the above experimental results with respect to silicon, which show that the thickness of oxide film is increased as the atmosphere varies from dry oxygen to wet oxygen, but there was no experimental data proving this assumption. To verify this assumption, the inventor of the present invention conducted a similar preliminary experiment using SiC, in which the ratio of the flow rates of hydrogen and oxygen was varied so as to change the partial pressure of water vapor, and found that SiC exhibited totally different characteristics than those of silicon. In this experiment, the flow rate of hydrogen was controlled to 8 liter/min., and the flow rate of oxygen was varied. Where the oxygen flow rate was excessively high, however, the flow rate of hydrogen was controlled to 4 liter/min.

As a specimen, there was prepared a p type SiC substrate whose plane orientation was (0001) Si-face and which was doped with Al at a carrier concentration of $1 \times 10^{16}$ cm$^{-3}$. This p type SiC was subjected to thermal oxidation at 1100° C. for five hours.

Figure 1:
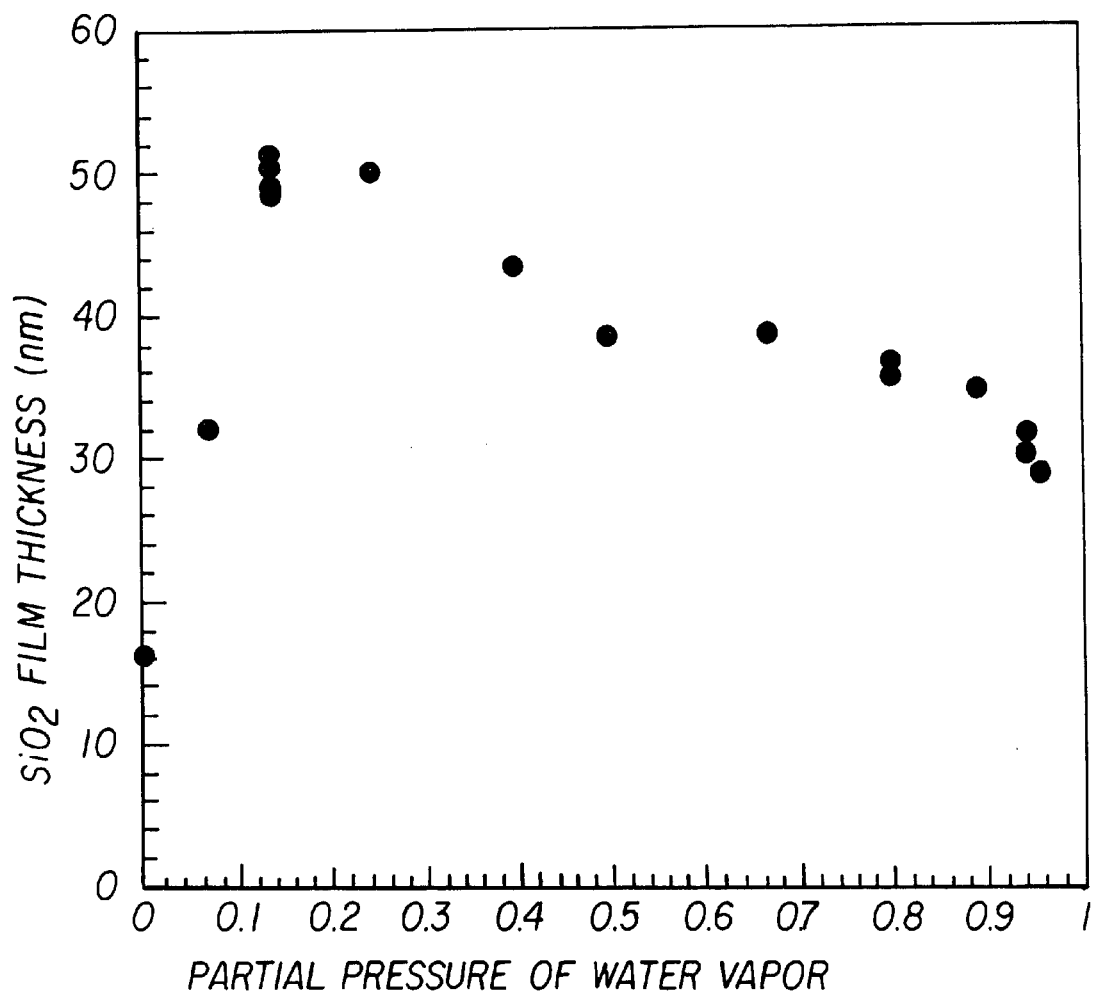
FIG. 1 is a graph showing the relationship between the thickness of oxide film formed on Si-face of SiC, and the partial pressure of water vapor.

FIG. 1 is a graph showing the relationship between the partial pressure of water vapor and the thickness of $SiO_2$ film. The horizontal axis represents the partial pressure of water vapor represented as $p(H_2O)/[p(H_2O)+p(O_2)]$. It is considered that the whole hydrogen reacts with oxygen whose amount is half the flow rate of hydrogen, to produce water vapor, and the remaining oxygen is kept in a gas state. The thickness of the $SiO_2$ film was measured by an ellipsometer.

As is understood from the graph of FIG. 1, the thickness of $SiO_2$ film shows a peak when the partial pressure of water vapor is around 0.2. In the pyrogenic oxidation method in which hydrogen and oxygen are introduced, it is too dangerous to control the partial pressure of water vapor to 1.0, namely, to produce an atmosphere consisting solely of water vapor. Judging from the experimental results of FIG. 1 in the vicinity of the partial pressure of 1.0, it may be assumed that the film thickness would be about 25 nm if the partial pressure of water vapor is made equal to 1.0. It follows that the thickness of an oxide film formed under a condition that the partial pressure of water vapor is around 0.2 is one and a half times as large as that of an oxide film formed at the maximum partial pressure of water vapor, i.e., 0.95, achieved in the experiment, and is almost twice as large as that of an oxide film that would be formed in the atmosphere that consists solely of water vapor. It will be understood from FIG. 1 that where the partial pressure of water vapor is in the range of 0.1 to 0.9, a $SiO_2$ film formed under this condition has a thickness that is larger by at least 20% than that of a $SiO_2$ film formed with the partial pressure being controlled to 0.95. Where the partial pressure of water vapor is in the range of 0.1 to 0.4, in particular, a $SiO_2$ film formed under this condition has a thickness that is larger by at least 50% than that of a $SiO_2$ film formed with the partial pressure being controlled to 0.95.

With regard to the above-described phenomenon that the thickness of $SiO_2$ film grown on SiC is increased as the partial pressure of water vapor is reduced, its mechanism and physical meaning have not been known, and are still under investigation.

The above experimental results have another significance. Conventionally, a SiO$_2$ film was formed on SiC by causing bubbling of oxygen in boiled pure water, and introducing wet oxygen into an electric furnace to effect thermal oxidation. This conventional method does not require special equipment, and therefore has been widely employed as an easy oxidation method. In this simple method, however, it is difficult to control the partial pressure of water vapor, as is understood from the above experimental results, which anticipates difficulty in precisely controlling the thickness of the resulting SiO$_2$ film. Namely, if the partial pressure of water vapor is varied, the growth rate of SiO$_2$ film is also varied, with a result of fluctuation or variations in the thickness of the SiO$_2$ film. Thus, it will be understood that control of the partial pressure of water vapor is extremely important in order to provide a SiO$_2$ film having a uniform thickness that is precisely controlled.

Experiment 2

Figure 2:
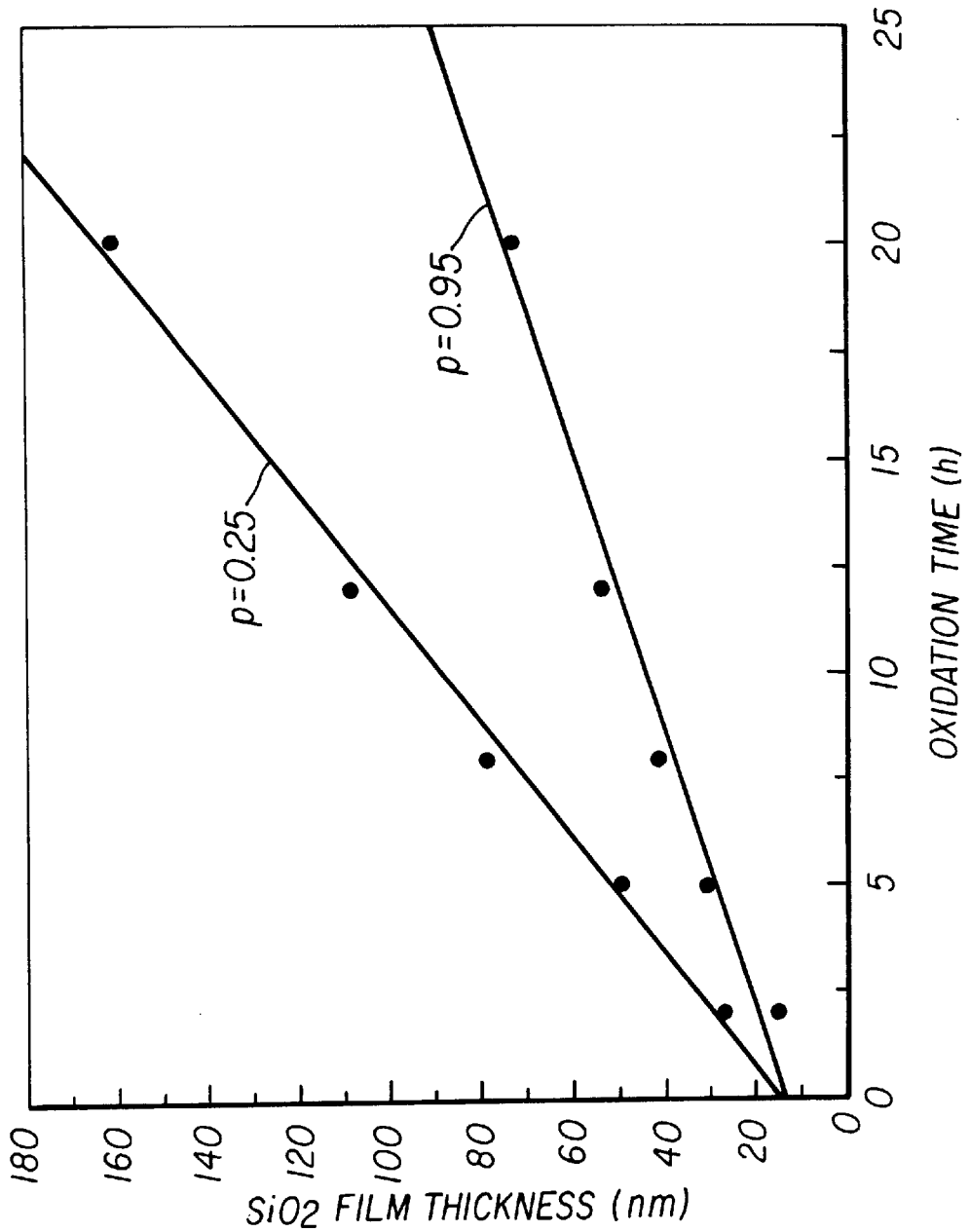
FIG. 2 is a graph showing the relationship between the oxidation time and the thickness of oxide film formed on Si-face of SiC.
Figure 3:
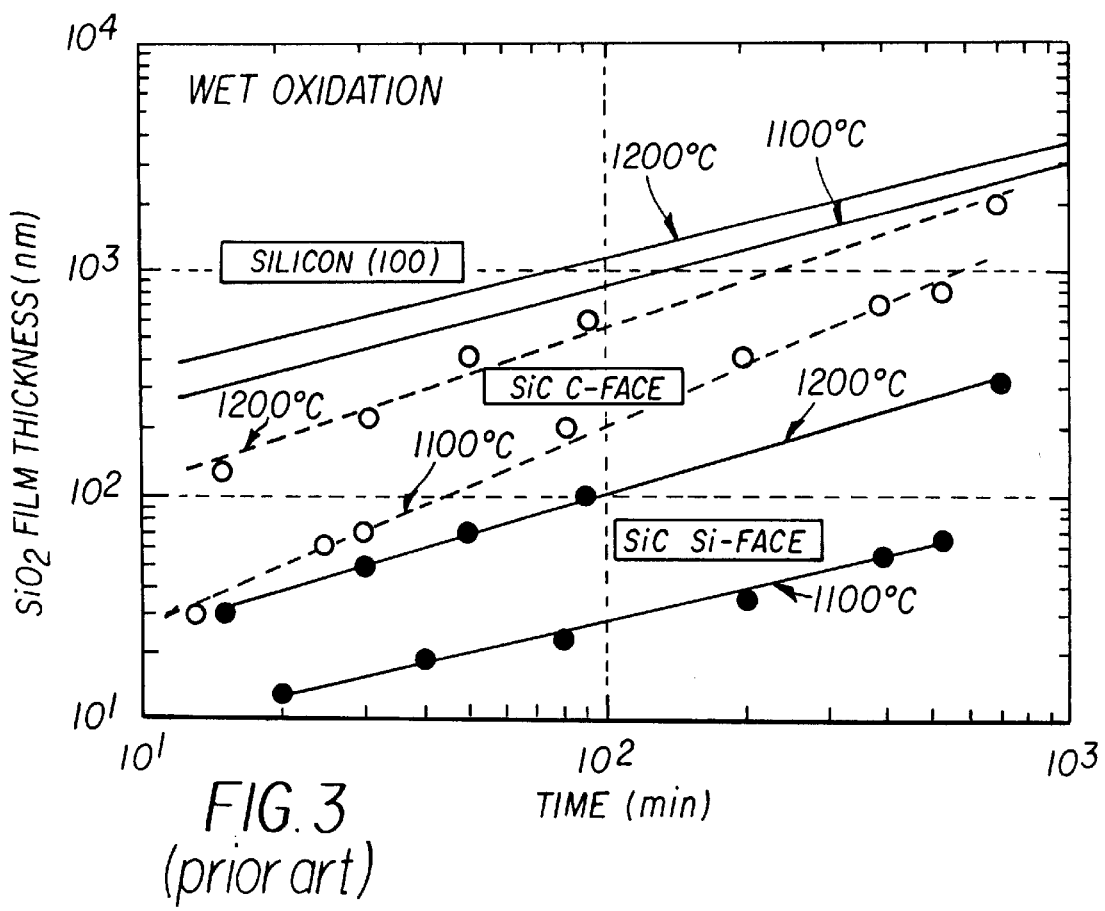
FIG. 3 is a graph showing the relationship between the oxidation time and the thickness of oxide film formed on SiC and silicon.

FIG. 2 is a graph showing the relationship between the oxidation time under different partial pressures of water vapor, and the thickness of SiO$_2$ film. In this experiment, the oxidation was conducted at a temperature of 1100° C. In the graph of FIG. 2, the horizontal axis represents oxidation time, that is, a period of time for which the oxidation was conducted.

To provide a SiO$_2$ film having a thickness of 50 nm, for example, the oxidation needs to be conducted for about 10 hours, in an atmosphere whose partial pressure of water vapor is 0.95 with the flow rate of hydrogen to that of oxygen being controlled to 1:0.55. If the ratio of the flow rate of hydrogen to that of oxygen is controlled to 1:3.5, so that the partial pressure of water vapor is lowered down to 0.25, only half of the above oxidation time, namely, about 5 hours, is needed for forming a SiO$_2$ film having the same thickness.

In the graph of FIG. 2, experimental values obtained in both cases can be plotted linearly, and it may be suggested that the film thickness be rapidly increased to about 15 nm in an initial oxidation stage. This initial oxidation stage seems similar to that of dry oxidation conducted on a silicon substrate.

Experiment 3

The inventor has found that the interface state density is reduced with an increase in the ratio of the hydrogen flow rate to the oxygen flow rate. Accordingly, it is rather undesirable in terms of the interface statel density to form a SiO$_2$ film under a condition of a low partial pressure of water vapor. For instance, the interface state density of SiO$_2$ film formed under a condition that the partial pressure of water vapor is equal to 0.2 is incommensurably smaller than that of a SiO$_2$ film formed on the C-face of the SiC substrate, but at least twice as large as that of a SiO$_2$ film formed under a condition that the partial pressure of water vapor is equal to 0.95.

In this experiment, therefore, after oxidation was conducted for four hours under a condition that the partial pressure of water vapor was equal to 0.2, to form a SiO$_2$ film, the SiC substrate was further oxidized for additional one hour with the partial pressure of water vapor being controlled to 0.94, so as to form an additional SiO$_2$ film. The total thickness of the resulting SiO$_2$ films was 48 nm, which is far larger than a thickness of 30 nm obtained when the oxidation was conducted for five hours with the partial pressure of water vapor being controlled to 0.95. Furthermore, the interface state density of the resulting SiO$_2$ film was equivalent to that of the SiO$_2$ film formed with the partial pressure of water vapor being controlled to 0.95.

In this manner, after a SiO$_2$ film providing a large proportion of the final thickness is formed under a condition of a relatively low partial pressure of water vapor, an additional SiO$_2$ film having the remaining thickness is formed under a condition of a relatively high partial pressure of water vapor, so that the resulting SiO$_2$ film having a low interface state density can be formed in a reduced oxidation time.

While the pyrogenic oxidation method in which the partial pressure of water vapor can be easily controlled was employed in the experiments as described above, the gist of the present invention resides in controlling the partial pressure of water vapor so as to achieve desired thermal oxidation. Thus, it is to be understood that the present invention is not limited to pyrogenic oxidation provided the partial pressure of water vapor can be precisely controlled.

As explained above, in the method for forming a thermal oxide film of a silicon carbide semiconductor device according to the present invention, the partial pressure of water vapor in a mixture of water vapor and oxygen gas is controlled to within the range of 0.1 to 0.9, so that the resulting SiO$_2$ film formed on Si-face of the SiC substrate has a thickness that is larger by 10% to 50% at maximum than that of a SiO$_2$ film obtained by a known method under a condition which was considered to provide the highest oxidation rate. On the other hand, the oxidation time required for forming a SiO$_2$ film having a certain thickness can be reduced, while assuring a sufficiently low interface state density.

SiO$_2$ films are an important constituent element of, in particular, MOS type semiconductor devices. According to the present invention, SiO$_2$ films having a low interface state density can be formed in a short oxidation time, which is advantageous in the manufacture of MOS type semiconductor devices having SiC substrates.

What is claimed is:

1. A method for forming a thermal oxide film of a silicon carbide semiconductor device, in which hydrogen and oxygen are introduced to thermally oxidize the surface of the silicon carbide by pyrogenic oxidation, wherein the flow rate of hydrogen to that of oxygen is controlled to within a range of 1:2 to 1:9.5 and a partial pressure of the water vapor is controlled to within a range of 0.1 to 0.4.

2. A method for forming a thermal oxide film of a silicon carbide semiconductor device according to claim 1, comprising the steps of:

forming a first portion of the silicon dioxide film at a first partial pressure of water vapor; and forming a second portion of the silicon dioxide film on said first portion of the silicon dioxide at a partial pressure of water vapor that is higher than said first partial pressure.

3. A method for forming a thermal oxide film of a silicon carbide semiconductor device by pyrogenic oxidation according to claim 1, comprising the steps of:

forming a first portion of the silicon dioxide film having a first thickness, while controlling a ratio of a flow rate of hydrogen to that of oxygen to about 1:4.5;

forming a second portion of the silicon dioxide film having a second thickness smaller than said first thickness, on said first portion of the silicon dioxide film, while controlling the ratio of the flow rate of hydrogen to that of oxygen to about 1:0.55.

* * * * *